(12) United States Patent
Tsukano et al.

(10) Patent No.: US 7,649,749 B2
(45) Date of Patent: Jan. 19, 2010

(54) WIRING SUBSTRATE, SEMICONDUCTOR DEVICE, AND METHOD OF MANUFACTURING THE SAME

(75) Inventors: Jun Tsukano, Kawasaki (JP); Kenta Ogawa, Kawasaki (JP); Takehiko Maeda, Kawasaki (JP); Shintaro Yamamichi, Tokyo (JP); Katsumi Kikuchi, Tokyo (JP)

(73) Assignees: NEC Electronics Corporation, Kanagawa (JP); NEC Corporation, Tokyo (JP)

( * ) Notice: Subject to any disclaimer, the term of this patent is extended or adjusted under 35 U.S.C. 154(b) by 18 days.

(21) Appl. No.: 11/822,599

(22) Filed: Jul. 9, 2007

(65) Prior Publication Data

US 2008/0012140 A1 Jan. 17, 2008

(30) Foreign Application Priority Data

Jul. 14, 2006 (JP) ............................. 2006-194353

(51) Int. Cl.
*H05K 1/11* (2006.01)
*H05K 1/14* (2006.01)
(52) U.S. Cl. .................. 361/795; 174/254; 257/669
(58) Field of Classification Search ................. 257/668, 257/669; 361/749, 360, 795; 174/254, 255, 174/260, 261, 262
See application file for complete search history.

(56) References Cited

U.S. PATENT DOCUMENTS

| 6,356,451 B1 * | 3/2002 | Nakagawa et al. ........... 361/760 |
| 2006/0192287 A1 * | 8/2006 | Ogawa et al. ............... 257/758 |

FOREIGN PATENT DOCUMENTS

| JP | 8-51258 | 2/1996 |
| JP | 11-163022 | 6/1999 |
| JP | 11-177191 | 7/1999 |
| JP | 2000-3980 | 1/2000 |
| JP | 2000-323613 | 11/2000 |
| JP | 2000-353863 | 12/2000 |
| JP | 2001-68510 | 3/2001 |
| JP | 2002-33555 | 1/2002 |
| JP | 2002-83893 | 3/2002 |
| JP | 2002-198462 | 7/2002 |
| JP | 2004-179647 | 6/2004 |
| JP | 2005-327780 | 11/2005 |
| WO | 2006/054637 | 5/2006 |

OTHER PUBLICATIONS

Chinese Patent Office issued a Chinese Office Action dated Aug. 7, 2009, Application No. 2007101364132.

* cited by examiner

*Primary Examiner*—David A Zarneke
*Assistant Examiner*—Jenny L Wagner
(74) *Attorney, Agent, or Firm*—Young & Thompson

(57) ABSTRACT

A wiring substrate includes a base insulating film, a first interconnection formed on a top surface side of the base insulating film, a via conductor provided in a via formed in the base insulating film, and a second interconnection provided on a bottom surface side of the base insulating film. The second interconnection is connected to the first interconnection via the via. The wiring substrate includes divided-substrate-unit regions, in each of which the first interconnection, the via, and the second interconnection are formed. The wiring substrate includes a warpage-controlling pattern on the base insulating film, with a warped shape such that when the wiring substrate rests on a horizontal plate, at least a central part of a plane surface of the substrate contacts the horizontal plate, with both ends of the side raised.

26 Claims, 13 Drawing Sheets

(a)

(b)

WIRING SUBSTRATE, SEMICONDUCTOR DEVICE, AND METHOD OF MANUFACTURING THE SAME

BACKGROUND OF THE INVENTION

1. Field of the Invention

The present invention relates to a wiring substrate on which a semiconductor chip is mounted, a semiconductor device using the wiring substrate, and a method of manufacturing the semiconductor device.

2. Description of the Related Art

Recent semiconductor devices with improved performance, increased number of functions, and increased density have an accordingly increased number of terminals arranged at a reduced pitch. Thus, wiring substrates for packaging on which semiconductor devices are mounted have been desired to have more densely arranged interconnections of further reduced sizes.

Built-up printed substrates, a kind of multilayer wiring substrate, have been commonly used as wiring substrates for packaging. In the built-up printed substrate, resin layers are formed on a top surface and a bottom surface of a glass epoxy printed substrate which serves as a base core substrate and on which interconnections are formed. Via holes are formed in the resin layers by the photolithographic process and the laser process. Interconnection layers and via conductors are then formed by plating and photolithography. A multilayer interconnection structure can be formed by repeating the resin layer forming step and the interconnection and via conductor forming step as required.

However, a problem with the built-up printed substrate is that because of the use of a glass epoxy printed substrate of low heat resistance as the base core substrate, deformation such as warpage or waviness is apt to occur in the substrate by heating during the formation of a multilayer structure or the mounting of a semiconductor chip.

On the other hand, the JP2000-3980A (Patent Document 1) discloses an wiring substrate for packaging in which a built-up laminated structure is formed on a base substrate made of a metal sheet.

FIG. 12 shows a diagram of a process of manufacturing the wiring substrate for packaging. First, as shown in FIG. 12(a), an insulating layer 502 is formed on a metal sheet 501. A via hole 503 is formed in the insulating layer 502. Then, as shown in FIG. 12(b), an interconnection pattern 504 is formed on the insulating layer 502 with the via hole 503 formed therein. Then, as shown in FIG. 12(c), an insulating layer 506 is formed on the interconnection pattern 504. A flip chip pad portion 505 extending to the interconnection pattern 504 is formed in the insulating layer 506. Finally, as shown in FIG. 12(d), the metal sheet 501 is etched from its bottom surface to form a substrate-reinforcing body 507 and external electrode terminals 508.

However, since in this wiring substrate for packaging, the external electrode terminals 508 are formed by etching the metal sheet 501, it is difficult to reduce the pitch between the external electrode terminals 508 owing to limits to the control of the amount of side etching. When the wiring substrate for packaging is mounted on an external board or in a device, stress concentrates at the interface between the external electrode terminal 508 and the insulating layer 502 because of the structure of the substrate. This disadvantageously increases the likelihood of open faults and prevents the substrate from being sufficiently reliable.

A wiring substrate for packaging capable of solving the above problems with the conventional techniques is disclosed in JP2002-198462A (Patent Document 2).

With reference to FIG. 13, description will be given of the basic structure of this wiring substrate and a method of forming the wiring substrate. First, an electrode 602 is formed on a support board 601 made of a metal sheet or the like. An insulating layer 603 is formed so as to cover the electrode 602. Then, a via hole 604 extending to the electrode 602 is formed in the insulating layer 603. An interconnection 605 is formed so as to fill the via hole 604. The interconnection 605 is connected to the electrode 602 by a conductor buried in the vial hole 604 (FIG. 13(a)). A multilayer interconnection structure can be formed by repeating the steps of forming an insulating layer, forming a via hole, and forming an interconnection as required. Then, as shown in FIG. 13(b), the support board 601 is selectively partly etched away to expose the electrode 602 and to form a support body 606. A wiring substrate 607 can thus be formed. The formation of a pad-like electrode pattern has been described here. However, a linear interconnection pattern can be similarly formed.

The support body 606 made of a heat-resistant material such as metal enables thermal deformation of the wiring substrate to be inhibited. The insulating layer made of a resin material of a desired mechanical strength provides a wiring substrate having a higher strength. Moreover, the bottom surfaces of conductor layers that constitute electrodes or interconnections are exposed with the peripheries of the conductor layers buried in the insulating layer. This inhibits stress concentration on the conductor layers during mounting, and improves mounting reliability.

Insulating layer materials suitable for the above wiring substrate are disclosed in JP2004-179647 A (Patent Document 3). To provide a wiring substrate and a semiconductor package which can inhibit generation of cracks caused by repeatedly applied thermal stress, offering improved reliability, this publication discloses an insulating layer in which when it has a film thickness of 3 to 100 μm and a fracture strength of at least 80 MPa at 23° C. and when the fracture strength at −65° C. is defined as a and the fracture strength at 150° C. is defined as b, the value of ratio (a/b) is at most 4.5. The publication also specifies that the insulating layer preferably exhibits a modulus of elasticity of at least 2.3 GPa at 150° C. The publication also discloses that when the modulus of elasticity at −65° C. is defined as c and the modulus of elasticity at 150° C. is defined as d, the value of the ratio (c/d) is specified to be at most 4.7. The publication further discloses that the value of the ratio (a/b) is at most 2.5 or greater than 2.5 and at most 4.5 and that the difference between the ratio (a/b) and the ratio (c/d) is specified to be at most 0.8.

On the other hand, proposal has been made of a technique for forming a dummy pattern in a part (sacrificing board part) of a wiring substrate other than its product part wherein semiconductor chips are mounted, in order to enhance the rigidity of the wiring substrate and to reduce warpage and waviness (distortion).

For example, JP8-51258 A (Patent Document 4) describes that a dummy pattern including hexagonal patterns arranged like a honeycomb is formed in a sacrificing board part of a wiring substrate to allow its rigidity to be enhanced. The publication also describes that the ratio of the area of the dummy pattern in the sacrificing board part to the area of the part with no dummy pattern is set almost equal to the ratio of the area of the interconnection pattern in the product part to the area of the part with no interconnection pattern to reduce warpage and distortion.

Further, JP11-177191 A (Patent Document 5) describes a wiring substrate having a solid pattern formed in a sacrificing board part located on a side thereof perpendicular to a transfer direction for component mounting and a dummy pattern formed in a sacrificing board part located on a side thereof parallel to the transfer direction for component mounting, the dummy pattern being composed of a plurality of divided pattern units. The publication describes rectangular or circular pattern units arranged at regular intervals as the dummy pattern in the sacrificing board part. According to the publication, the solid pattern enhances rigidity and the divided dummy pattern reduces warpage and distortion. Further, the rigidity of the substrate of a multilayer structure can be enhanced by varying the shape or arrangement pitch of the pattern units for each layer.

In contrast to the technique for reducing warpage and waviness on the basis of the structure (pattern structure) of a substrate itself, a technique has been proposed which improves mounting capability on the basis of a device in which a semiconductor chip is mounted and a method of mounting. For example, JP2001-68510 A (Patent Document 6) describes a method of mounting a semiconductor chip on a warped substrate using a bonding device that mounts a semiconductor chip on the basis of a flip chip scheme. According to the publication, a substrate is placed on a stage with a suction hole. A pressure reducing mechanism is then used to generate a suction force in the suction hole to allow the bottom surface of the substrate to be sucked and held by a surface of the stage. At this time, the warpage of the substrate is corrected to make the substrate parallel to the stage surface. A substrate holding mechanism pushes the substrate against the stage. This brings the substrate into accurate, tight contact with the stage, eliminating the gap between the substrate and the stage to prevent air leakage. This enables the prevention of a possible decrease in holding force resulting from air leakage, allowing the prevention of possible misalignment between the substrate and semiconductor chip during a stage operation or bonding.

The present inventors have recognized as follows. A growing need for thinner substrates prevents the conventional warpage inhibiting techniques from exerting a sufficient warpage inhibiting effect particularly on substrates having interconnection structures such as the one described in Patent Document 2. If a wiring substrate with no semiconductor chip mounted yet is warped on a stage, the wiring substrate may be misaligned with respect to the stage when placed on and fixed to the stage, or transferring the wiring substrate may become difficult. This unfortunately degrades the reliability and productivity of products.

Even if a wiring substrate is placed on a stage using a method such as the one described in Patent Document 6, the substrate with a semiconductor chip mounted thereon may disadvantageously be warped with its central part raised along the transfer direction. When the substrate is warped with its central part raised, during transfer thereof, the substrate with the chip mounted thereon may disadvantageously comes into contact with a member that is located over a transfer route such as a substrate holding guide or a heating cover.

SUMMARY OF THE INVENTION

An object of the present invention is to provide a wiring substrate on which a semiconductor chip can be appropriately mounted, a semiconductor device produced using the wiring substrate, and a method of manufacturing a semiconductor device in which a semiconductor chip can be more appropriately mounted.

In accordance with aspects of the present invention, there are provided the following wiring substrates, semiconductor devices and methods of manufacturing a semiconductor device.

(1) A wiring substrate comprising:
a base insulating film;
a first interconnection formed on a top surface side of the base insulating film;
a via conductor provided in a via hole formed in the base insulating film; and
a second interconnection provided on a bottom surface side of the base insulating film, the second interconnection being connected to the first interconnection via the via conductor,
wherein the wiring substrate comprises a plurality of divided-substrate-unit regions, in each of which the first interconnection, the via conductor, and the second interconnection are formed;
the wiring substrate further comprises a warpage-controlling pattern on the base insulating film; and
the wiring substrate has a warped shape such that when the wiring substrate is left at rest on a horizontal plate, at least a central part of each side of a plane surface of the substrate contacts the horizontal plate, with both ends of the side raised, wherein each of the sides extends along a second direction perpendicular to a first direction in the plane surface of the substrate.

(2) The wiring substrate described in item 1, wherein
the first interconnection is provided in a sunken section formed on a top surface side of the base insulating film;
the warpage-controlling pattern is provided in another sunken section formed on the top surface side of the base insulating film and comprises a linear pattern that allows the wiring substrate to be warped so that both ends of each side of a plane surface of the wiring substrate lie above a central part of the side, wherein each of the sides extends along the second direction in the plane surface of the substrate; and
the wiring substrate has a warped shape such that when the wiring substrate is left at rest on a horizontal plate with the first interconnection forming surface side facing upward, at least a central part of each side of the plane surface of the substrate contacts the horizontal plate, with both ends of the side raised, wherein each of the sides extends along the second direction.

(3) The wiring substrate described in item 2, wherein the warpage-controlling pattern is provided at least in a peripheral part of a region in which a plurality of the divided-substrate-unit regions are formed.

(4) The wiring substrate described in item 2 or 3, wherein for the warpage-controlling pattern and the first interconnection, a component ratio (X/Y) of a total component of X-components extending along the first direction to a total component of Y-components extending along the second direction is greater than 1.

(5) The wiring substrate described in item 3 or 4, wherein the warpage-controlling pattern comprises a line and space pattern extending along the first direction.

(6) The wiring substrate described in any one of items 3 to 5, wherein the warpage-controlling pattern comprises a plurality of pattern units that are separated from one another.

(7) The wiring substrate described in item 6, wherein the pattern units in the warpage-controlling pattern are arranged in a matrix.

(8) The wiring substrate described in any one of items 2 to 7, wherein a ratio (R1/R2) of a planar projected area ratio R1

(A/B) of an in-sunken section pattern area A to an out-sunken section area B in a warpage-controlling-pattern-forming region outside the divided-substrate-unit regions to a planar projected area ratio R2 (P/Q) of a in-sunken section interconnection area P to an out-sunken section area Q inside each of the divided-substrate-unit regions is in a range of 0.8 to 1.2.

(9) The wiring substrate described in any one of items 2 to 8, wherein the planar projected area ratio (A/B) of the in-sunken section pattern area A to the out-sunken section area B in the warpage-controlling-pattern-forming region outside the divided-substrate-unit regions is in a range of 0.1 to 0.5.

(10) The wiring substrate described in any one of items 2 to 9, wherein the warpage-controlling pattern is formed of the same material as that of the first interconnection and has the same thickness as that of the first interconnection.

(11) The wiring substrate described in any one of items 2 to 10, wherein the top surface of the first interconnection is located below the top surface of the base insulating film.

(12) The wiring substrate described in any one of items 2 to 10, wherein the top surface of the first interconnection is co-planar with the top surface of the base insulating film.

(13) The wiring substrate described in any one of items 1 to 12, further comprising a solder resist layer on the bottom surface side of the substrate.

(14) The wiring substrate described in any one of items 1 to 13, wherein the divided-substrate-unit regions are arranged in a matrix.

(15) The wiring substrate described in item 14, wherein the divided-substrate-unit regions are arranged so that the number of divided-substrate-unit regions arranged along the first direction is larger than that of divided-substrate-unit regions arranged along the second direction.

(16) The wiring substrate described in any one of items 1 to 15, which is shaped like a rectangle such that each side of the wiring substrate extending along the first direction is longer than each side thereof extending along the second direction.

(17) The wiring substrate described in any one of items 1 to 16, which has a warped shape such that each side of the wiring substrate extending in the first direction is entirely raised.

(18) The wiring substrate described in any one of items 1 to 17, further comprising one or more interconnection structure layers each including an insulating layer provided on the bottom surface side of the base insulating layer, a via conductor provided in a via hole formed in the insulating layer, and an interconnection provided on a bottom surface of the insulating layer, the interconnection being connected to an upper interconnection via the via conductor.

(19) The wiring substrate described in any one of items 1 to 18, wherein the base insulating film is made of a heat-resistant resin or a fiber-reinforced heat-resistant resin composite material.

(20) A semiconductor device comprising the wiring substrate described in any one of items 1 to 19, and a semiconductor chip mounted on a top surface side of the wiring substrate, the semiconductor chip being connected to the first interconnection formed on the top surface side of the wiring substrate.

(21) A method of manufacturing a semiconductor device, comprising the steps of:

preparing the wiring substrate described in any one of items 1 to 19;

placing the wiring substrate on a stage so that a first direction of the wiring substrate extends along a transfer direction and so that a top surface side of the wiring substrate with a first interconnection formed thereon faces upward;

mounting a semiconductor chip on the top surface side of the wiring substrate; and transferring the wiring substrate with the semiconductor chip mounted thereon, in the first direction.

(22) The method of manufacturing a semiconductor device, described in item 21, wherein the stage includes a retainer that holds both sides of the wiring substrate placed on the stage where the both sides extend along the first direction, and the method further comprises the step of holding both sides of the wiring substrate placed on the stage using the retainer where the both sides extend along the first direction.

(23) The method of manufacturing a semiconductor device, described in item 21 or 22, wherein the stage includes sucking means for fixedly sucking the wiring substrate placed on the stage, and the method further comprises the step of fixing the wiring substrate placed on the stage by sucking.

The present invention can provide a wiring substrate on which a semiconductor chip can be appropriately mounted. The present invention can also provide a method of manufacturing a semiconductor device which enables a semiconductor chip to be stably mounted and allows a substrate with the semiconductor chip mounted thereon to be more appropriately transferred, improving productivity.

DETAILED DESCRIPTION OF THE PREFERRED EMBODIMENTS

Examples in accordance with preferred embodiments of the present invention will be described below.

Interconnection Structure

Figure 1:
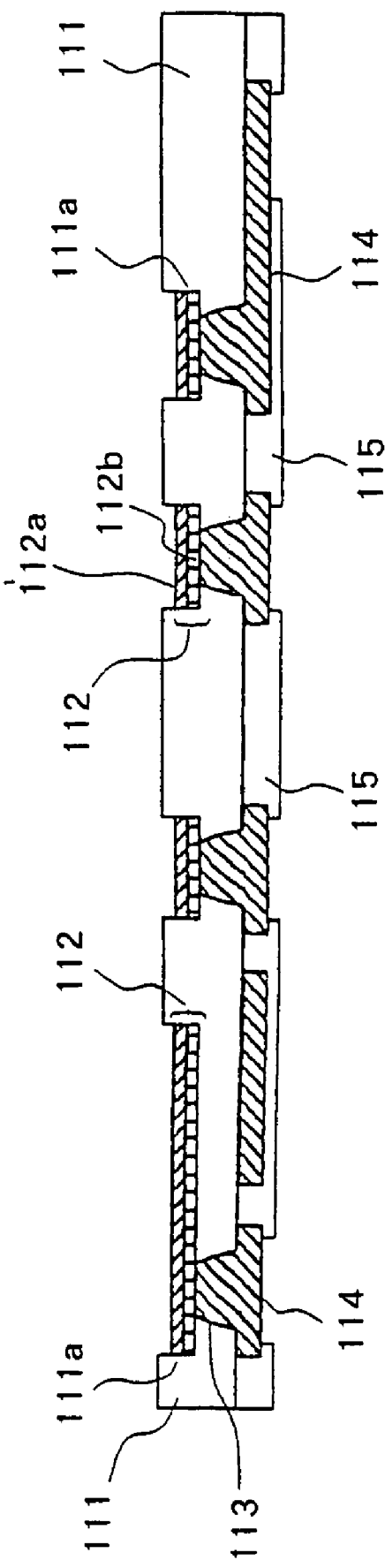
FIG. 1 is a sectional view showing an example of the interconnection structure of a wiring substrate in accordance with an embodiment of the present invention.

First, with reference to FIG. 1, description will be given of the basic interconnection structure of a wiring substrate in accordance with an embodiment of the present invention.

A wiring substrate in accordance with the embodiment has a base insulating film 111, an upper layer interconnection 112 (112a, 112b) provided on a top surface side of the base insulating film, a conductor provided in a via hole 113 formed in the base insulating film, and a lower layer interconnection 114 connected to the upper layer interconnection via the via conductor and formed on a bottom surface of the base insulating film. The upper layer interconnection 112 is provided in a sunken section 111a formed in a top surface of the base insulating film 111. A solder resist layer 115 is formed on a bottom surface side of the base insulating film 111 so as to expose a part of the lower layer interconnection 114 while covering the remaining part of the lower layer interconnection 114. The exposed part can be utilized as a pad electrode.

The upper layer interconnection 112 is formed so as to fill the sunken section 111a formed in the top surface of the base insulating film 111. This releases stress and strain applied to the upper layer interconnection, allowing stress concentration to be reduced. This in turn makes it possible to improve the reliability of the connections in the substrate.

The exposed top surface of the upper layer interconnection 112 is located below the horizontal surface of the top surface of the base insulating film to constitute a part of the top surface of the wiring substrate. That is, the sunken section with a bottom surface that corresponds to the top surface of the upper layer interconnection is formed in the top surface of the wiring substrate. The sunken section with a bottom surface that corresponds to the top surface of the upper layer interconnection can be set to have a depth of, for example, about 0.5 to 10 μm. The sunken section makes it possible to prevent bumps from being misaligned or flowing. This enables the improvement of the positional accuracy and reliability of connections for a semiconductor chip having pads arranged at a small pitch. Too shallow a sunken section fails to exert the above effects sufficiently, whereas too deep a sunken section hinders sufficient connections and makes it difficult to fill an underfill when the underfill is provided.

The upper layer interconnection 112 can be formed of metal such as Cu, Ni, Au, Al, Pd, or Ag. The thickness of the upper layer interconnection can be set at, for example, 2 to 20 μm. The width of the upper layer interconnection can preferably be set within the range of 10 to 500 μm, preferably 15 to 500 μm, more preferably 20 to 100 μm, typically 20 to 40 μm.

The upper layer interconnection in the wiring substrate in accordance with an embodiment of the present invention may have a laminated structure. In FIG. 1, the upper layer interconnection 112 has a two-layer structure composed of an upper side etching barrier layer 112a and a lower side interconnection main-body layer 112b. The etching barrier layer is made of, for example, Ni, Au, or Pd, and can prevent the upper layer interconnection from being etched during a step of etching away a support board described below.

In connection with characteristics required for the wiring substrate, the strength, workability, and preparation of a film material, the thickness of the base insulating film 111 can be set at, for example, 3 to 300 μm, preferably 20 to 200 μm, more preferably 20 to 100 μm. Too thin a base insulating film prevents a sufficient strength from being achieved, whereas too thick a base insulating film reduces the microfabrication workability of the via hole. The material for the base insulating film can be selected from various resins and resin composite materials in accordance with a desired characteristic such as heat resistance or mechanical strength.

The via hole 113 is formed in a region immediately below the sunken section 111a of the base insulating film 111. The diameter of the via hole is set at, for example, about 30 to 80 μm depending on the type of the semiconductor package. A conductive material is buried in the via hole so as to connect to the upper layer interconnection.

The lower layer interconnection 114 is formed on the bottom surface of the base insulating film 111 and is electrically connected to the upper layer interconnection 112 via the conductive material in the via hole. The lower layer interconnection can be formed integrally with the conductive material in the via hole. The thickness of the lower layer interconnection can be set at, for example, 2 to 20 μm. The solder resist layer 115 is formed on the bottom surface of the base insulating film 111 so as to expose a part of the lower layer interconnection, while covering the remaining part of the lower layer interconnection. The exposed part of the lower layer interconnection forms a pad electrode. The thickness of the solder resist layer can be set at, for example, 2 to 40 μm.

Figure 2:
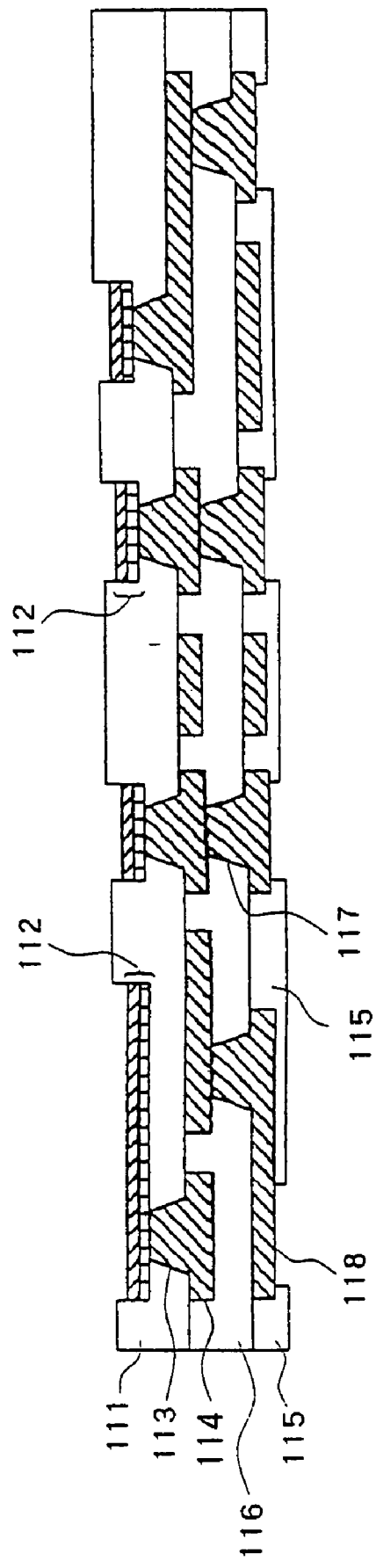
FIG. 2 is a sectional view showing another example of the interconnection structure of a wiring substrate in accordance with an embodiment of the present invention.

As shown in FIG. 2, the wiring substrate in accordance with an embodiment of the present invention may have a multilayer structure having an interlayer insulating film 116, a via hole 117, and a second lower layer interconnection 118 on the bottom surface side of the base insulating film 111 and lower layer interconnection 114. The second lower layer interconnection 118 can be formed similarly to the lower layer interconnection 114. The second lower layer interconnection 118 is electrically connected to the lower layer interconnection 114 via the conductive material in the via hole 117. The solder resist layer 115 is formed on the bottom surface of the interlayer insulating film 116 so as to expose a part of the second lower layer interconnection 118, while covering the remaining part of the second lower layer interconnection 118. The exposed part of the second lower layer interconnection forms a pad electrode. The thickness of the solder resist layer can be set at, for example, 2 to 40 μm.

In accordance with an embodiment of the present invention, the wiring substrate may have a multilayer interconnection structure having multiple interlayer insulating films wherein an interlayer insulating film, a via hole, and a lower layer interconnection are further provided in addition to the above multilayer interconnection structure. The multilayer interconnection structure enables an increase in the number of signals input to a semiconductor chip mounted on the substrate.

The entire thickness of the wiring substrate in accordance with an embodiment of the present invention can be set within the range of 20 to 350 μm, preferably 80 to 300 μm.

For the planar size of the wiring substrate in accordance with an embodiment of the present invention, its long side can be set at, for example, 100 to 350 mm (preferably 150 to 300 mm), and its short side can be set at, for example, 50 to 150 mm (preferably 50 to 100 mm). The projection area of the plane surface of the substrate can be set within the range of, for example, 5,000 to 50,000 mm², preferably 7,000 to 30,000 mm², more preferably 10,000 to 25,000 mm². More specifically, for example, a wiring substrate of 190 mm×65 mm or 230 mm×80 mm and of thickness 260 mm can be produced.

Figure 3:
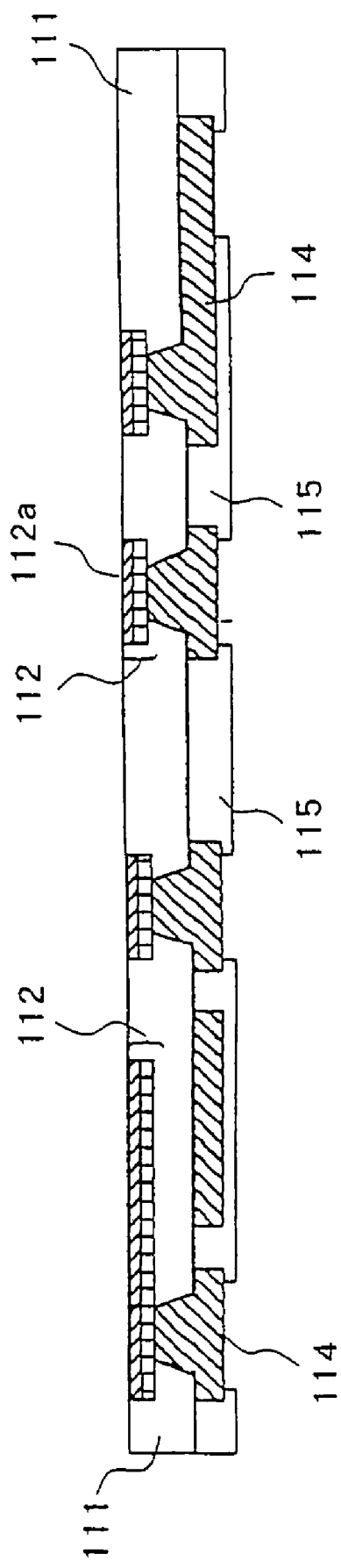
FIG. 3 is a sectional view showing another example of the interconnection structure of a wiring substrate in accordance with an embodiment of the present invention.

As shown in FIG. 3, the wiring substrate in accordance with an embodiment of the present invention may be configured so that the top surface of the upper layer interconnection is flush with the top surface of the base insulating film 111. If a semiconductor chip having pads arranged at a small pitch is mounted using bumps, the above structure can provide a sufficient margin for misalignment, improving the connection reliability. The wiring substrate in accordance with an embodiment of the present invention may be configured so that a top surface of the upper layer interconnection protrudes from the plane of the top surface of the base insulating film.

Now, with reference to FIG. 4, description will be given of examples of forms of the wiring substrate on which a semiconductor chip is to be mounted.

Figure 4:
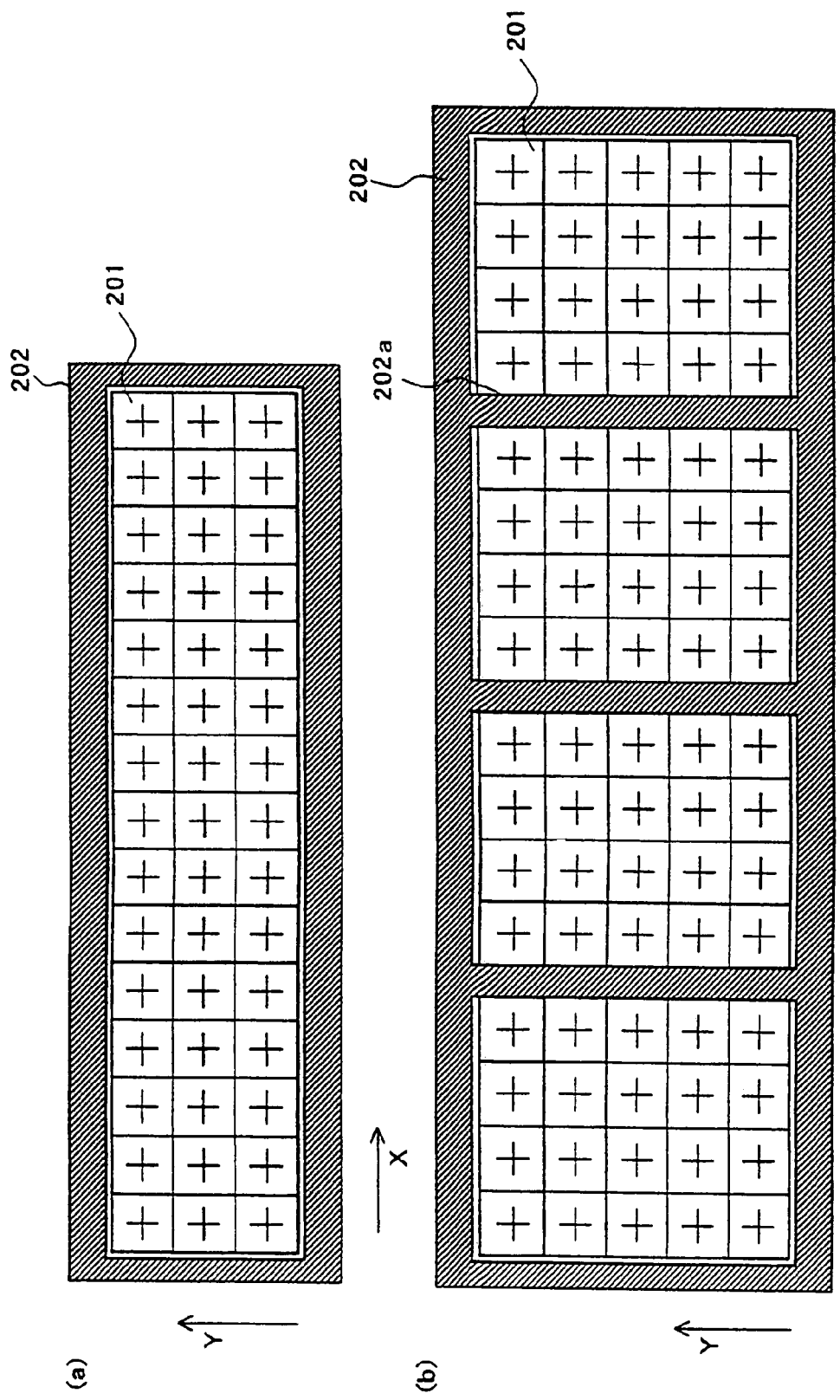
FIG. 4 is a plan view showing examples of the interconnection structure of a wiring substrate in accordance with an embodiment of the present invention.

In connection with productivity and handleability, the wiring substrate having the above basic interconnection structure may be formed so that a single substrate is divided to form a plurality of substrate-unit regions (product parts) 201 that correspond to substrates for target products, the substrate-unit regions being arranged in a matrix (or like blocks) as shown in FIG. 4 (this form of substrate is hereinafter referred to as a "block substrate" as required). Here, each substrate-unit region of the wiring substrate refers to a unit region of substrate region for a wiring substrate used for a target semiconductor package in which one predetermined semiconductor chip or a set of predetermined semiconductor chips are mounted. A warpage-controlling pattern described below can be provided in a peripheral region 202 surrounding the periphery of the substrate-unit regions arranged in a matrix. To allow the operation of mounting semiconductor chips to be appropriately performed, all the substrate-unit regions 201 are preferably arranged in the same direction. Further, for productivity for the mounting of semiconductor chips, the wiring substrate in accordance with an embodiment of the present invention is preferably shaped like a rectangle such that its side extending along the transfer direction (in the figure, the side extending in an X-direction) is longer than its side crossing along the transfer direction (in the figure, the side extending in a Y-direction). A semiconductor chip is mounted in each of the substrate-unit regions of the wiring substrate. The wiring substrate is then divided into pieces so that the substrate-unit regions are independently separated from one another. This results in a plurality of products (semiconductor packages), and each product has a substrate that corresponds to one of the substrate-unit regions. A plurality of component units that correspond to target wiring substrates are thus provided in one substrate to facilitate handling of wiring substrates during transportation and to enable the productivity of semiconductor packages to be increased.

Figure 14:
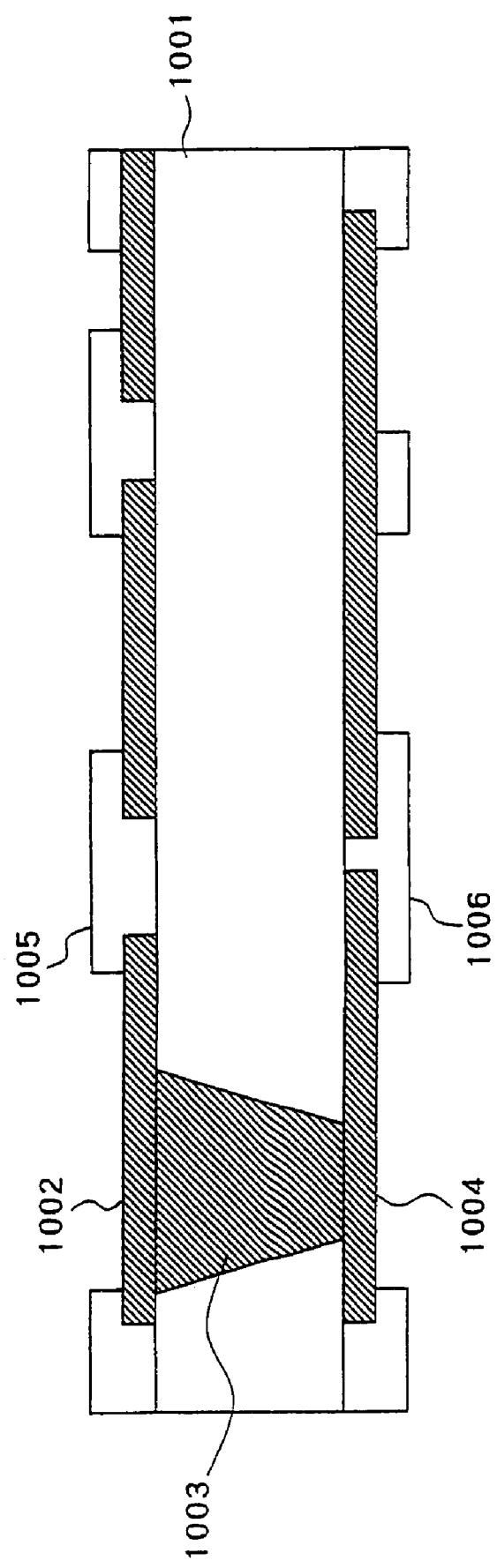
FIG. 14 is a sectional view showing another example of the interconnection structure of a wiring substrate in accordance with an embodiment of the present invention.

FIG. 14 shows another example of the basic structure of the wiring substrate in accordance with an embodiment of the present invention.

This wiring substrate has a base insulating film (core film) 1001, an upper layer interconnection 1002 provided on a top surface side of the base insulating film, a via conductor 1003 provided in a via hole formed in the base insulating film, and a lower layer interconnection 1004 connected to the upper layer interconnection via the via conductor and formed on a bottom surface side of the base insulating film. A solder resist layer 1005 is formed on the top surface side of the base insulating film 1001 so as to expose a part of the upper layer interconnection 1002, while covering the remaining part of the upper layer interconnection 1002. Further, a solder resist layer 1006 is formed on the bottom surface side of the base insulating film 1001 so as to expose a part of the lower layer interconnection 1004, while covering the remaining part of the lower layer interconnection 1004.

For the material and size, the upper layer interconnection and the lower layer interconnection can be formed similarly to those having the interconnection structure described with reference to FIG. 1. The base insulating film, the via conductor, and the solder resist can also be formed similarly to those having the interconnection structure described with reference to FIG. 1. Further, the substrate having the interconnection structure in the present example can be formed into a block substrate as described with reference to FIG. 4. Its planar size can also be set as described above.

Even with the wiring substrate having the interconnection structure in the present example, providing a warpage-controlling pattern to create a-particular warped shape described below allows semiconductor chips to be more appropriately mounted. This also allows wiring substrates to be more properly transferred, improving productivity.

Warpage-Controlling Pattern

Figure 5:
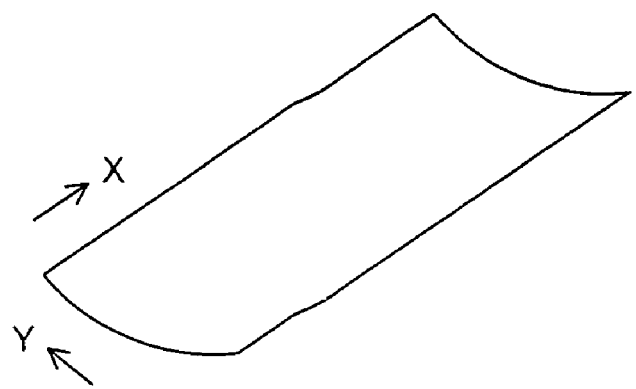
FIG. 5 is a diagram illustrating warped shapes of wiring substrates.
Figure 5:
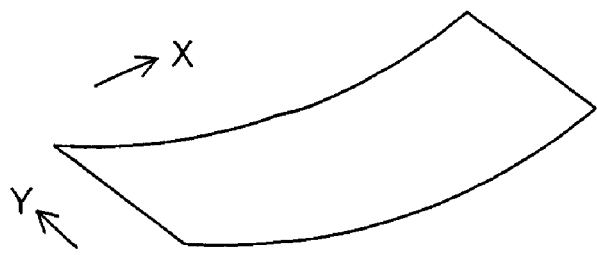

The present inventors have noted that such a block substrate as described above is likely to be warped so that the substrate surface on the side of the upper layer interconnection constitutes a valley. In particular, the present inventors have found that if the wiring substrate is left at rest on a horizontal plate with its upper-layer-interconnection-forming side facing upward to allow a semiconductor chip to be mounted on the upper-layer-interconnection-forming side, when more of the upper layer interconnection is present in the X-direction in an X-Y orthogonal coordinate system, the wiring substrate is warped in such a manner as to raise the both ends of each of the sides (short sides) extending along the Y-direction (raise the both sides thereof extending in the X-direction) as shown in FIG. 5(a). In contrast, when more of the upper layer interconnection is present in the Y-direction, the wiring substrate is warped in such a manner as to raise the both ends of each of the sides (long sides) extending along the X-direction (raise the both sides thereof extending along the Y-direction) as shown in FIG. 5(b).

Such warpage of the substrate is probably attributable to the fact that more of the upper layer interconnection 112, provided in the sunken section 111a on the top surface side of the base insulating film 111, is located on the top surface side than on the bottom surface side of the base insulating film. It is probable that stress resulting from heat and pressure generated during a fabrication process is applied disproportionately to either the top or bottom surface side of the base insulating film to generate stress strain, causing the substrate to be warped. Since the upper layer interconnection is buried in the sunken section of the top surface of the base insulating film, not only the bottom surface of but also the side periphery of the interconnection contact the base insulating film; there is a large contact area between the interconnection and the insulating film. This probably increase the stress strain in the entire base insulating film.

In an embodiment of the present invention, a dummy interconnection pattern is formed as warpage-controlling pattern; the dummy interconnection pattern has a structure similar to that of the upper layer interconnection 112, that is, the pattern structure provided in the sunken sections of the top surface of the base insulating film; and warpage of the wiring substrate is controlled by utilizing the orientation of stress induced by this pattern structure. This warpage-controlling pattern enables a wiring substrate with a particular warped shape to be formed. The pattern provided in the sunken section of the top surface of the base insulating film is hereinafter referred to as an "in-sunken section pattern" as required. The warpage-controlling pattern and the upper layer interconnection 112 are both in-sunken section patterns.

The warpage-controlling pattern in accordance with an embodiment of the present invention can be provided in a peripheral part of the upper-layer-interconnection-forming region, that is, the peripheral part surrounding a plurality of the substrate-unit regions. For example, as shown in FIG. 4(a), the warpage-controlling pattern can be formed in a peripheral region 202 of the block substrate. Alternatively, the warpage-controlling pattern can be formed in a lattice-like region 202a as well as in the peripheral region 202 as shown in FIG. 4(b). The warpage-controlling pattern can be formed simultaneously with the upper layer interconnection. The warpage-controlling pattern can thus be easily formed at the same accuracy at which the interconnection is formed, without the need to add complicated steps. The warpage-controlling pattern may be provided in the substrate-unit regions as a dummy interconnection as required.

The warpage-controlling pattern preferably includes a plurality of linear patterns extending along a particular direction according to a desired warped shape. As such a pattern, a line and space pattern is preferable.

Figure 6:
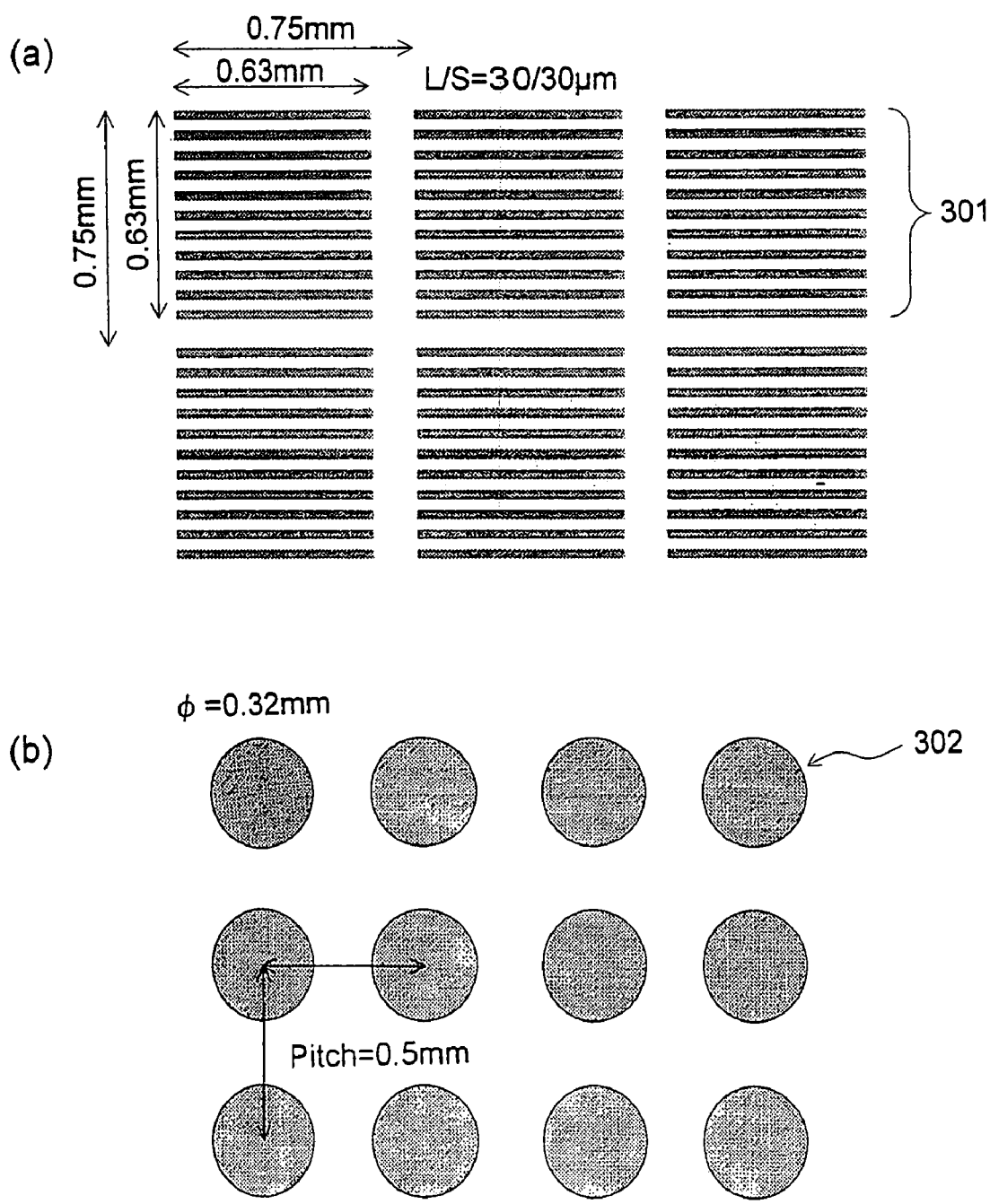
FIG. 6 is a diagram showing examples of a part of a pattern on the wiring substrate in accordance with an embodiment of the present invention.

The warpage-controlling pattern provided in the peripheral part is preferably composed of a plurality of pattern units separated from one another, in order to prevent the possible deformation of the substrate resulting from the warpage-controlling pattern, for example, the possible waviness of the substrate. The plurality of pattern units can be arranged in a matrix, for example, as shown in FIG. 6(a). It is likely that this separation enables stress probably causing deformation to be appropriately dispersed in the area between the pattern units in which no pattern is provided.

In addition to the warpage-controlling pattern, a support pattern composed of a plurality of support units separated from one another may be provided. For example, a plurality of support units formed of solid patterns can be arranged in a matrix in the peripheral part of the interconnection forming region as shown in FIG. 6(b). The support pattern composed of these support units serves as a reinforcing body that holds the shape of the wiring substrate (block substrate). The support pattern can be utilized as a gripping margin for transfer or a nipping allowance for sealing. Each support unit formed of a solid pattern may be shaped like a polygon such as a square or a rectangle instead of a circle. This support pattern reinforces the wiring substrate to enhance the ability to retain the shape of the wiring substrate, while effectively inhibiting the possible deformation, for example, the possible waviness, of the wiring substrate. The separated arrangement of the support pattern composed of a plurality of support units enables stress possibly causing deformation to be appropriately dispersed in the area between the support units where no pattern is provided. The support pattern can be formed simultaneously with the upper layer interconnection. The support pattern can thus be easily formed at the same accuracy at which the interconnection is formed, without the need to add complicated steps.

As a specific example of the block substrate, the block substrate shown in FIG. 4(a) can be set to have an external size of, for example, 190 mm×65 mm, and each substrate-unit region 201 can be set to have an external size of, for example, 12 mm×13 mm. In the peripheral area 202 of the substrate, the warpage-controlling pattern shown in FIG. 6(a) can be formed, that is, a pattern having pattern units 301 arranged in a matrix and each composed of a line and space pattern (line width: 30 μm, space width: 30 μm) so as to surround the substrate unit regions 201 arranged in a matrix. Instead of being sized as shown in FIG. 6(a), the line and space pattern may be sized to have a line width of 30 μm and a space width of 60 μm. The line and space pattern has a warpage controlling function, while the matrix arrangement of the pattern units 301 has a function for preventing deformation of the plane surface of the substrate resulting from the patterns themselves. In an embodiment of the present invention, the support pattern shown in FIG. 6(b) may be placed inside the warpage-controlling pattern shown in FIG. 6(a) so as to surround the substrate-unit regions 201 arranged in a matrix. The occupancy ratio and layout of these two types of patterns can be set in accordance with desired effects.

The warped wiring substrate (block substrate) can pose a serious problem for the fabrication of a semiconductor package both before and after the mounting of a semiconductor chip.

When the wiring substrate placed on a stage is warped with its central part raised, for example, in such a manner that each side of the wiring substrate extending in the X- or Y-direction (in FIG. 4, each long or short side, respectively) is bent like a hill (that is, the wiring substrate is warped in the direction opposite to that shown in FIGS. 5(a) and 5(b)), misalignment is likely to occur during placing the wiring substrate on the stage and fixing to it with a substrate fixture in an existing device, or if the wiring substrate is thinner, it can be wrinkled, and it is accordingly difficult to stably mount a semiconductor chip on the wiring substrate. Further, when the substrate with a semiconductor chip mounted thereon is warped with its central part raised, it can disadvantageously come into contact with a member located above a transfer route, such as a substrate holding guide or a heating cover. These can unfortunately degrade the reliability and productivity of products.

In an embodiment of the present invention, the upper-layer-interconnection-forming side of the wiring substrate is used as a chip-mounting surface, and the wiring substrate is placed on a transfer rail or a stage with the upper-layer-interconnection-forming side facing upward. This makes it possible to prevent the substrate from being warped with its central part raised before chip mounting. This is based on the fact that when left at rest on a horizontal plate with its upper-layer-interconnection-forming side facing upward, the wiring substrate in accordance with an embodiment of the present invention is likely to be warped so as to bend the upper-layer-interconnection-forming surface like a valley as described above with reference to FIGS. 5(a) and 5(b).

However, even when the wiring substrate is placed on the transfer rail or stage with its upper-layer-interconnection-forming side facing upward, if each side of the wiring substrate extending in the transfer direction is warped like a valley, for example, each side (long side) of the wiring substrate extending along the X-direction, the transfer direction, is warped like a valley as shown in FIG. 5(b) (that is, the wiring substrate is warped in such a manner as to raise both sides thereof (both short sides) extending along the Y-direction), it is difficult to convey the substrate with an existing device because the raised part comes into contact with or hangs up on the member located above the transfer route. If such warpage occurs, more of the upper layer interconnection is formed in the Y-direction, that is, the Y-component of the upper layer interconnection is larger than its X-component (X/Y<1). For such a wiring substrate, a warpage-controlling pattern having an X-component larger than a Y-component (X/Y>1) is provided to offset stress resulting from the upper layer interconnection with stress of the warpage-controlling pattern. This makes it possible to inhibit the warpage of the wiring substrate.

The warpage of the wiring substrate can be inhibited by balancing the X- and Y-components of the upper layer interconnection and the warpage-controlling pattern as described above. However, even the wiring substrate with its possible warpage inhibited may disadvantageously be warped with its central part raised along the transfer direction after the mounting of a semiconductor chip. When warped with its central part raised, the chip mounting substrate can unfortunately come into contact with or hang up on the member located above the transfer route, such as the substrate holding guide or heating cover during the transfer. This is probably due to the thermal shrinkage of the solder resist layer, which is provided on the lower-layer-interconnection-forming surface. That is, it is probable that, in a step of mounting a semiconductor chip and in a thermal treatment conducted during a subsequent step, the solder resist is thermally shrunk to cause a stronger shrinking force to act the bottom surface side of the wiring substrate, where the solder resist is provided, than that to act the top surface side thereof; this causes the wiring substrate to be warped with its central part raised. Since the wiring substrate in accordance with an embodiment of the present invention uses the upper-layer-interconnection-forming side (top surface) as a chip mounting surface, the amount of resin (solder resist) on the lower-layer-interconnection-forming surface (bottom surface) is larger than that of resin layer (mount material or the like) on the top surface. Accordingly, the amount of thermal shrinkage on the bottom surface side is larger than that on the top surface side.

In accordance with an embodiment of the present invention, a particular shape of warpage of the wiring substrate with no chip mounted yet is formed, so as to inhibit the warpage of the wiring substrate with a chip mounted thereon. In order to form this warpage, an in-sunken section pattern is provided on the upper-layer-interconnection-forming side (top surface) as a warpage-controlling pattern. This warpage-controlling pattern is configured to form warpage such that both ends of each side of the wiring substrate extending in the direction (Y-direction) perpendicular to the transfer direction (X-direction) are raised. For example, as shown in FIG. 5(a), the wiring substrate can be formed so that each side thereof (short side) extending in the Y-direction is warped like a valley (the wiring substrate is warped in such a manner as to raise each side thereof (long side) extending in the X-direction). Forming a particular shape of warpage on the wiring substrate in advance as described above makes it possible to inhibit warpage after the mounting of a semiconductor chip. It is probable that stress resulting in the particular shape of warpage offsets possible stress generated after the mounting of a semiconductor chip, inhibiting possible warpage after the mounting.

Such a particular shape of warpage of the wiring substrate can be formed by setting the composition ratio (X/Y) of the total component of the X-components to the total component of the Y-components of the upper layer interconnections and the warpage-controlling pattern greater than 1. To cause more sufficient warpage, it is preferable to set the composition ratio (X/Y) equal to or greater than 55/45, more preferably equal to or greater than 60/40. If the component ratio (X/Y) excessively increases to form a significant warpage, it is difficult to fix and transfer the wiring substrate with an existing device. Accordingly, the component ratio is preferably set within an appropriate range in accordance with the fixing and transfer mechanism of the device. The component ratio can be set, for example, equal to or smaller than 90/10.

Figure 7:
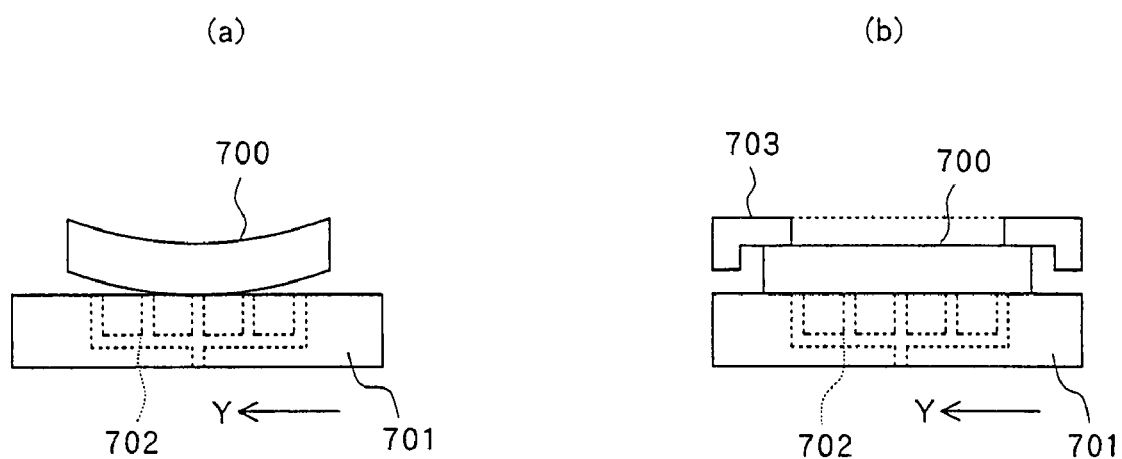
FIG. 7 is a diagram showing an example of a holding mechanism for a wiring substrate on a stage.

Even with the wiring substrate having the above particular shape of warpage, a semiconductor chip can be appropriately mounted on the substrate by, for example, the method described below. FIGS. 7(a) and 7(b) show a holding mechanism for a wiring substrate on a stage. FIG. 7(a) shows a wiring substrate 700 left at rest on a stage 701 so that the wiring substrate 700 is transferred in the X-direction; the wiring substrate 700 corresponds to the wiring substrate shown in FIG. 5(a) and warped so that the sides thereof (short sides) extending along the Y-direction are bent like valleys, whereas both sides thereof (long sides) extending along the X-direction are raised. The wiring substrate with this warped shape has its bottom surface sucked and held onto a surface of the stage by the suction force exerted through suction ports in the stage surface which is connected to suction lines 702 under reduced pressure. The warpage is thus corrected. Then, as shown in FIG. 7(b), the both ends of the wiring substrate in the Y-direction, that is, both sides thereof (long sides) in the X-direction, are fixed by a retainer 703. A semiconductor chip is subsequently mounted on the substrate. On the other hand, when the wiring substrate warped with its central part raised is held and fixed, its peripheral part is held by the suction force exerted through the suction ports, with its central part remaining raised, and accordingly this makes it difficult to appropriately fix the wiring substrate. Thus, the wiring substrate is likely to be misaligned, and if the substrate is thinner, it can be wrinkled.

As described above, an embodiment of the present invention enables the wiring substrate with no semiconductor chip mounted yet to be appropriately fixed to the stage, preventing misalignment. This allows the semiconductor chip to be more properly mounted. The embodiment can also prevent possible warpage after the mounting of the semiconductor chip, allowing the substrate with the semiconductor chip mounted thereon to be appropriately transferred. These enable the improvement of the productivity of semiconductor packages and the reliability of products.

The warped shape of the wiring substrate in accordance with an embodiment of the present invention is such that when the wiring substrate is left at rest on a horizontal plate with the upper-layer-interconnection-forming side (top surface) facing upward, at least the central part of each side thereof extending in the direction (Y-direction) perpendicular to the substrate transfer direction (X-direction) contacts the horizontal plate, with the both ends thereof raised as described above. For example, the warped shape is such that each side (short side) of the wiring substrate extending in the Y-direction is bent like a valley, whereas both sides thereof (long sides) extending in the X-direction are raised, as shown in FIG. 5(a).

The warpages of the sides (Y sides) of the wiring substrate extending in the Y-direction each is such that the central part of the Y side contacts the horizontal plate and such that the contact region contains the middle point of the Y side and such that the length of the contact area is preferably one-third or less of, more preferably one-fourth or less of that of the Y side. On the other hand, the warpages of the sides (X sides) of the wiring substrate extending in the X-direction each is such that the central part of the X side may contact the horizontal plate but the entire X side is preferably raised in order to exert a more sufficient warpage inhibiting effect. If the central parts of the X sides each contact the horizontal plate, then preferably the contact region contains the middle point of the X side and the length of the contact area is one-third or less of, more preferably one-fourth or less of that of the X side. A smaller contact area of the X side which is located in the central part thereof makes it possible to more easily inhibit warpage after a semiconductor chip has been mounted on the wiring substrate on an existing transfer mechanism.

For the warped shape in accordance with an embodiment of the present invention, the amount by which the both ends of each side are raised may be appropriately set in accordance with the size of the block substrate and the degree to which the wiring substrate with the semiconductor chip mounted thereon is warped. However, to exert a sufficient warpage controlling effect, this amount is preferably set equal to or greater than 0.2 mm, more preferably, equal to or greater than 0.5 mm, most preferably, equal to or greater than 1 mm. On the other hand, to prevent possible defects resulting from an unwanted magnitude of warpage, the amount is preferably set equal to or smaller than 5 mm, more preferably, equal to or smaller than 4 mm, most preferably, equal to or smaller than 3 mm.

The warped shape of the wiring substrate to be controlled in accordance with an embodiment of the present invention (the warped shape observed before the mounting of a semiconductor chip) is affected by the in-sunken section pattern (upper layer interconnection and warpage-controlling pattern) provided on the top surface side of the base insulating film as described above. The wiring substrate is likely to be warped if the amount of one of the coordinate components of the X-Y orthogonal coordinate system contained in the in-sunken section pattern is larger than that of the other contained in the in-sunken section pattern. To obtain the particular warped shape in accordance with an embodiment of the present invention, it is preferable that the ratios (X/Y; hereinafter referred to as "pattern component ratios") of X-component of the in-sunken section pattern to Y-component thereof are greater than 1.

Figure 8:
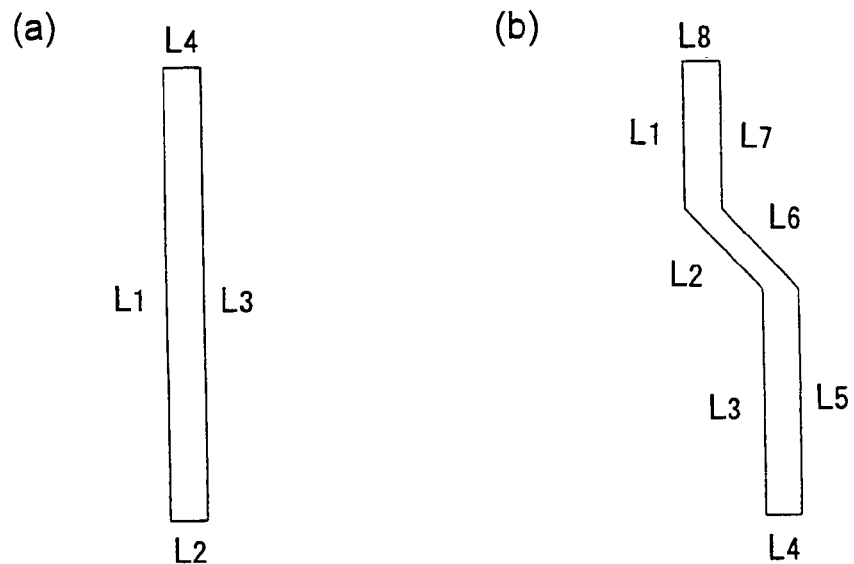
FIG. 8 is a plan view illustrating X-components and Y-components of patterns in an embodiment of the present invention.

Here, the X- and Y-components of the pattern in accordance with the embodiment refer to the X- and Y-components, respectively, of pattern profile lines in the X-Y orthogonal coordinate system. The pattern profile lines each corresponds to the tangent between the pattern member (upper layer interconnection member and warpage-controlling pattern member) in the in-sunken section and the base insulating film. For example, in a pattern shown in FIG. 8(a), reference numerals L1 to L4 denote profile lines, and in a pattern shown in FIG. 8(b), reference numerals L1 to L8 denote profile lines. The pattern component ratio (X/Y) indicates the ratio of the sum of the X-components (absolute value) to the sum of the Y-components (absolute value) of the profile lines in a predetermined pattern.

Figure 9:
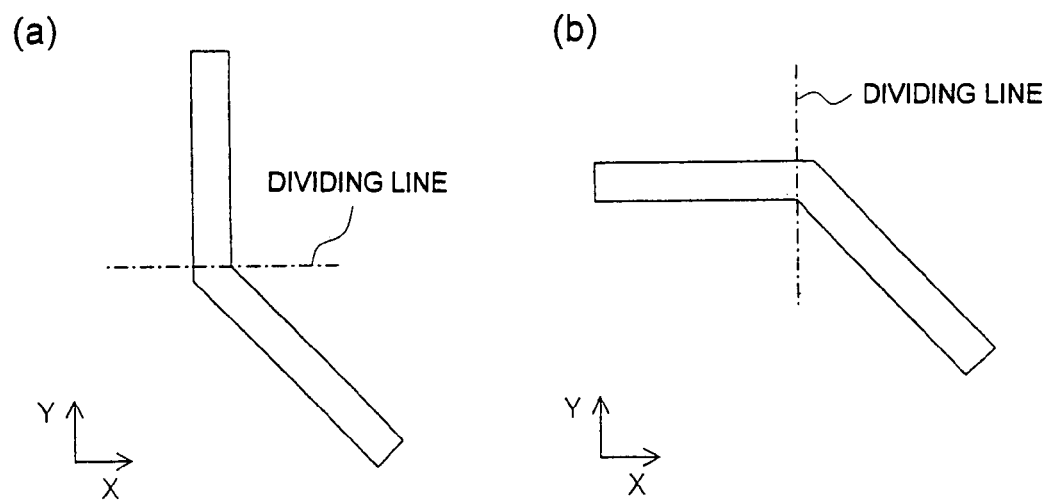
FIG. 9 is a plan view illustrating boundaries of examples of patterns in an embodiment of the present invention.

An embodiment of the present invention is effective on a wiring substrate having an upper layer interconnection pattern in which the total of the linear patterns extending along the X-direction and the linear patterns extending along the Y-direction accounts for an area ratio of at least 60%, or at least 70%, or particularly at least 80% of the entire upper layer interconnection pattern. Here, the area ratio is based on the area (planar projected area) of the plane surface of the substrate occupied by the pattern itself. That is, the area ratio of the linear pattern of the upper layer interconnection means the ratio of the area occupied by the total of the linear patterns extending along the X-direction and the linear patterns extending along the Y-direction to the area occupied by the entire upper layer interconnection pattern in the plane surface of the substrate. If a linear pattern extending along the X- or Y-direction is continuous with another pattern, the boundary between the two patterns is one of the dividing lines extending along the X- and Y-directions, and the dividing line corresponds to the width direction of the linear pattern. FIGS. 9(a) and 9(b) each shows a dividing line used when a linear pattern extending along the X- or Y-direction is continuous with a slant pattern.

In an embodiment of the present invention, a warpage-controlling pattern is provided such that the pattern component ratio (X/Y) of the in-sunken section patterns is at least greater than 1 in accordance with the disproportionate pattern component ratio of the upper layer interconnection. The warpage-controlling pattern in accordance with an embodiment of the present invention has a pattern component ratio (X/Y) of greater than 1 so as to obtain a desired warped shape. The pattern component ratio (X/Y) is preferably at least 1.5, more preferably at least 3, most preferably at least 12 for an effective suppression of the warpage. In particular, for excellent warpage controllability and easiness with which a pattern can be formed, the warpage-controlling pattern is preferably shaped like a line extending along the transfer direction (X-direction). Typically, a line and space pattern is preferred.

The area occupation rate of the upper layer interconnection in the wiring substrate in accordance with an embodiment of the present invention is preferably within the range of 5 to 70%, more preferably within the range of 10 to 60%, most preferably within the range of 15 to 45%. Too low an area occupation rate precludes the formation of desired dense interconnections. Too high an area occupation rate makes it difficult to ensure the insulation between interconnections in connection with working accuracy.

Here, the area occupation rate of the upper layer interconnection refers to the percentage ratio of the area occupied by the upper layer interconnections to the area of the upper-layer-interconnection-forming region in one component unit of the plane surface of the wiring substrate. The upper-layer-interconnection-forming region refers to a region in a quadrangle of the minimum area enclosing all the upper layer interconnections in one component unit. The component unit refers to a unit of the wiring substrate or the corresponding substrate region (corresponding to the substrate-unit region 201) used in a target semiconductor package on which one predetermined semiconductor chip or a set of predetermined semiconductor chips are mounted.

The planar projected area ratio (A/B) of the in-sunken section pattern area A to the out-sunken section area B in the warpage-controlling-pattern-forming region is preferably within the range of 0.1 to 0.5, more preferably within the range of 0.2 to 0.4 in connection with working accuracy and the warpage-controlling effect. Here, the warpage-controlling-pattern-forming region refers to a region of the minimum area composed of lines extending along the X- and Y-directions which enclose a warpage-controlling pattern formed around the outer periphery of substrate-unit regions.

Further, the ratio of the planar projected area ratio (A/B) of the in-sunken section pattern area A to the out-sunken section area B in the warpage-controlling-pattern-forming region to the planar projected area ratio (P/Q) of the in-sunken section interconnection area P to the out-sunken section area Q in the upper-layer-interconnection-forming region (in each substrate-unit region) is preferably within the range of 0.8 to 1.2, more preferably within the range of 0.9 to 1.1 in order to prevent the waviness of the substrate. The in-sunken section interconnection in the upper-layer-interconnection-forming region corresponds to the upper layer interconnection and includes, if any, a dummy interconnection formed in the substrate-unit region as a warpage-controlling pattern (in-sunken section pattern).

The warpage-controlling pattern can be formed simultaneously with the pattern formation of the upper layer interconnection. The material and thickness of the warpage-controlling pattern can be similar to those of the upper layer interconnection. The width, length, and shape of the warpage-controlling pattern can be set in accordance with the pattern of the upper layer interconnection. Further, the pattern density of the warpage-controlling pattern can be appropriately set in accordance with the pattern density of the upper layer interconnection patterns in the component unit (product part) of the substrate. Warpage control can be effectively performed using a warpage-controlling pattern region having a pattern density at least substantially equivalent to that of the upper layer interconnection pattern.

Base Insulating Film

Description will be given below of resin materials preferably used as the base insulating film in accordance with an embodiment of the present invention.

The material for the base insulating film in accordance with an embodiment of the present invention can be selected from various kinds of resin materials according to desired characteristics such as heat resistance and mechanical strength. For example, for mechanical strength and heat resistance, a composite resin material composed of a heat resistant resin containing a reinforcing material, preferably a fiber-reinforced resin composite material may be used. A favorable reinforcing material may be reinforcing fibers made of glass or aramid. The heat resistant resin may have a glass transition temperature equal to or higher than a prescribed temperature, preferably at least 150° C. The glass transition temperature is in accordance with JIS C6481 and can be measured by the DMA (Dynamic Mechanical Analysis) method. Examples of the heat resistant resin include epoxy resin, polyimide resin, cyanate resin, and liquid crystal polymer. In connection with the manufacture of a composite resin, the epoxy resin can be preferably used because the reinforcing fibers can be appropriately impregnated with this resin. To satisfactorily manufacture fine via holes by laser or the like, the reinforcing fibers preferably have a diameter of at most 10 μm.

By controlling the physical properties of the base insulating film made of the resin material described above taking into account the thickness-wise coefficient of thermal expansion, modulus of elasticity, and fracture strength of the base insulating film, as well as the temperature dependence of these characteristics, it is possible to improve reliability by preventing possible cracking caused by repeatedly imposed thermal loads and thermal deterioration such as open faults at connections. A wiring substrate with excellent mechanical properties and heat resistance can be provided by, for example, setting the film thickness at 20 to 100 μm and establishing conditions described below. The modulus of elasticity and fracture strength of an insulating film can be measured by conducting a tension test in accordance with "JPCA Standard, Build-up Interconnection Substrate JPCA-BU01, Section 4.2" for 1-cm wide rectangle test pieces.

(1) Coefficient of thermal expansion in the thickness direction: at most 90 ppm/K, If the modulus of elasticity at a temperature of t° C. is defined as Dt and the fracture strength at a temperature of t° C. is defined as Ht, (2) $D23 \geqq 5$ GPa, (3) $D150 \geqq 2.5$ GPa (4) $D-65/D150 \leqq 3.0$ (5) $H23 \geqq 140$ MPa (6) $H-65/H150 \leqq 2.3$.

Satisfying the condition (1) enables a reduction in strain stress in the thickness direction caused by repeatedly applied thermal stress, allowing the prevention of open faults at connections. Satisfying the condition (2) ensures that the wiring substrate can be properly transferred during the assembly of the semiconductor package. Satisfying the condition (3) offers a sufficient wire bonding capability. Since GPa of $D150 \geqq 2.5$ GPa is achieved and the glass transition temperature of the heat resistant resin is at least 150° C., a high wire bonding capability is obtained. Satisfying the condition (4) reduces a variation in the modulus of elasticity caused by a difference in temperature. This in turn reduces strain stress caused by repeated heating and cooling steps to allow the warpage of the semiconductor package to be inhibited. Satisfying the condition (5) inhibits the possible breakage of the base insulting film, allowing the wiring substrate to be adequately handled and transferred during the assembly of the semiconductor package. Satisfying the condition (6) reduces a variation in fracture strength caused by a difference in temperature. This ensures the sufficient durability of the base insulating film in high-temperature processing steps such as wire bonding.

In addition to the above resin materials, resin materials such as those disclosed in the JP2004-179647A can be used. That is, to inhibit cracking caused by repeatedly applied thermal stress to provide a reliable semiconductor package, a resin material can be used which has a film thickness of 3 to 100 μm and a fracture strength of at least 80 MPa at 23° C.; further, for this resin material, when the fracture strength at −65° C. is defined as "a" and the fracture strength at 150° C. is defined as "b", ratio (a/b) is at most 4.5. A favorable resin material can be also favorably used which has a modulus of elasticity of at least 2.3 GPa at 150° C. in addition to these conditions. Furthermore, when the modulus of elasticity at −65° C. is defined as "c" and the modulus of elasticity at 150° C. is defined as "d", it is possible to favorably use a resin material having a ratio (c/d) of at most 4.7 or a resin material having a ratio (a/b) of at most 2.5 or greater than 2.5 but at most 4.5 and for which the difference between the ratio (a/b) and the ratio (c/d) has an absolute value of at most 0.8 in addition to the above conditions. As such a resin material, any of the above fiber-reinforced resin composite materials and heat resistant resins can be used.

Structure of Semiconductor Device

Now, the structure of a semiconductor device in accordance with an embodiment of the present invention will be described.

Figure 10:
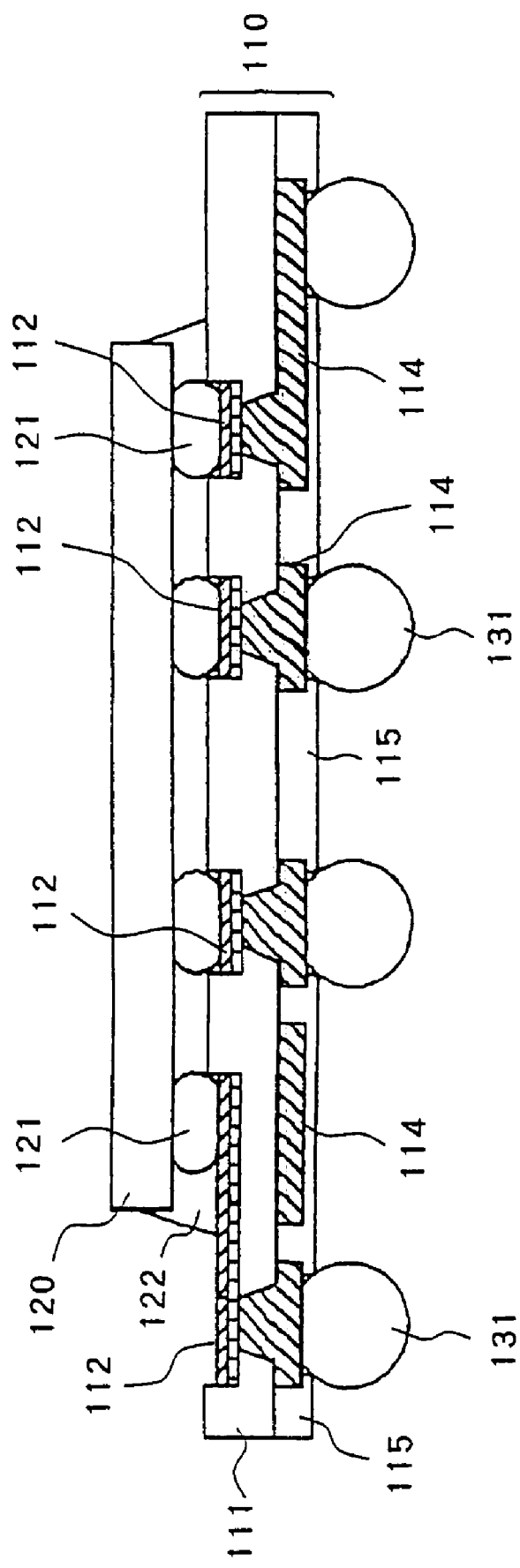
FIG. 10 is a sectional view showing an example of a semiconductor device in accordance with an embodiment of the present invention.

FIG. 10 shows an example of a semiconductor device. According to an embodiment of the present invention, a bump 121 is connected to an upper layer interconnection 112 in a wiring substrate 110. A semiconductor chip 120 electrically connected to the bump 121 is provided on the top surface side of the wiring substrate 110. An example of the semiconductor chip is a silicon chip with an integrated circuit such as an LSI formed thereon. An underfill 122 is provided between the semiconductor chip and the wiring substrate. On the other hand, a solder ball 131 is provided in an exposed part of a lower layer interconnection 114 of the wiring substrate 110, that is, in a part of a pad electrode. The solder ball is electrically connected to an electrode of the semiconductor chip 120 via the lower layer interconnection 114, a conductor within a via hole, the upper layer interconnection 112, and the bump 121. A semiconductor package having this structure is mounted on an external board (not shown) via the solder ball 131.

In the above structure, molding is provided as required and may be omitted. When the semiconductor chip needs to be protected or reinforced, the semiconductor chip may be coated with a mold resin. Although in this example, the semiconductor chip is mounted on the wiring substrate via the bump and the wiring substrate is then mounted on the board via the solder ball, these connections may be made by wire bonding or tape bonding.

For the wiring substrate, which has the multilayer interconnection structure, described with reference to FIG. 2, a semiconductor chip can be mounted on the wiring substrate and the wiring substrate can then be mounted on a board in the same manner as those in the above example. Wire bonding or tape bonding can also be used for connections involved in the mounting of the semiconductor chip on the wiring substrate and in the mounting, on the board, of the wiring substrate with the semiconductor chip mounted thereon.

Method of Manufacturing Wiring Substrate

Figure 11:
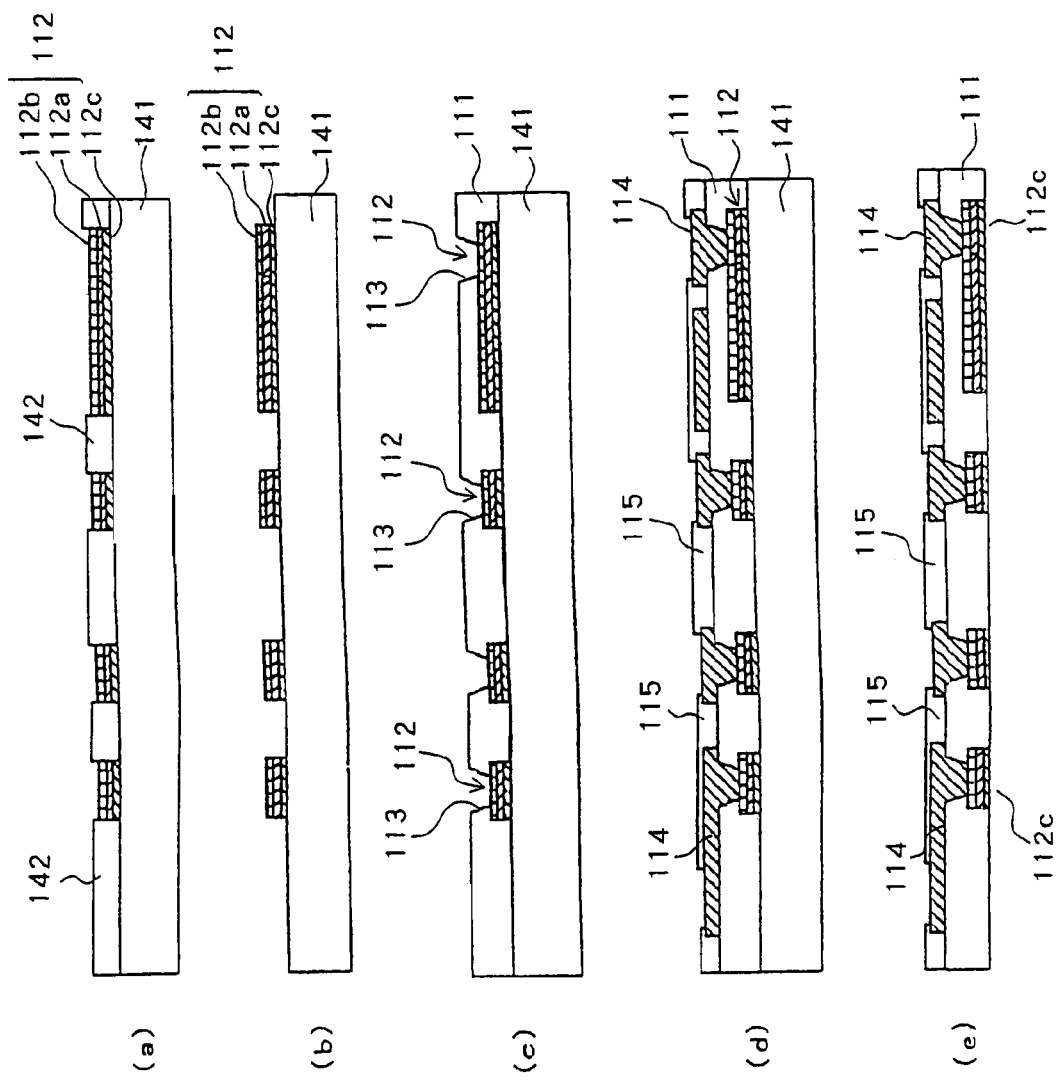
FIG. 11 is a sectional view of a process for manufacturing a wiring substrate in accordance with an embodiment of the present invention.
Figure 12:
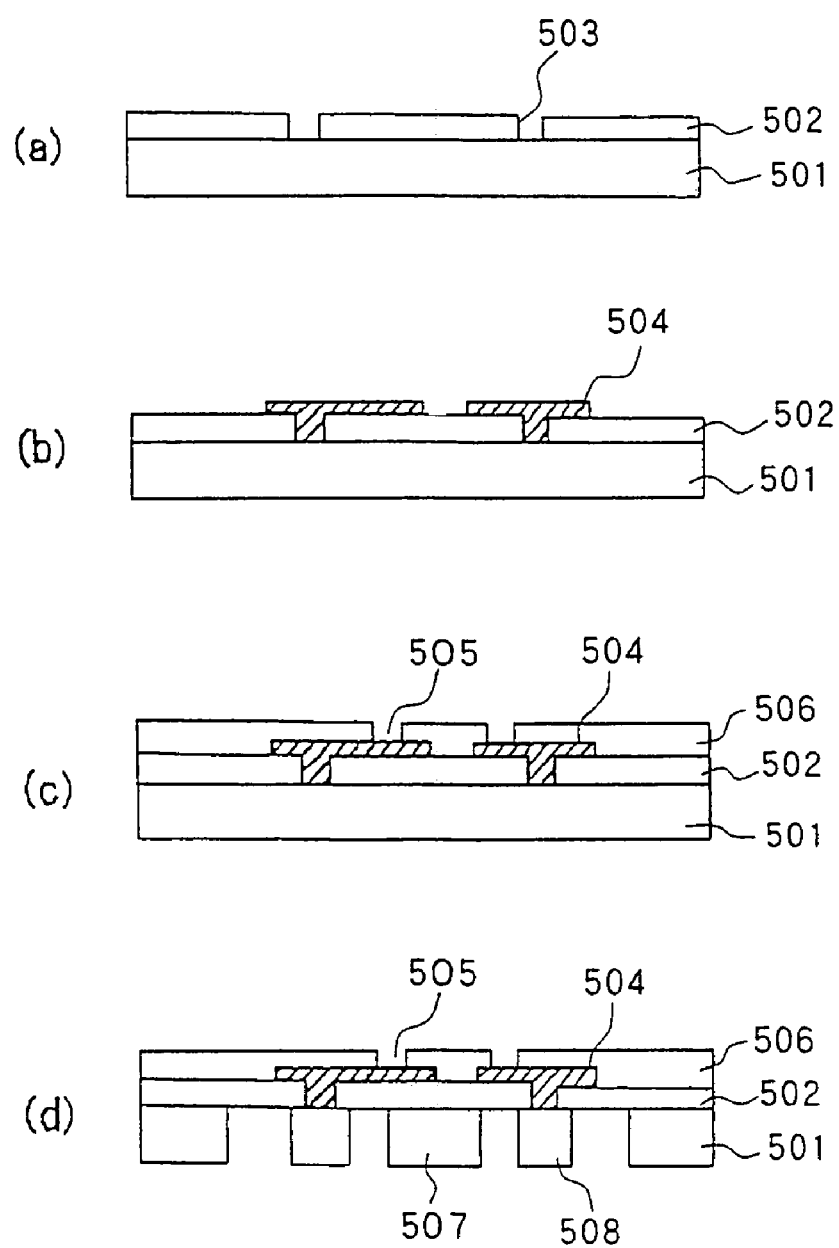
FIG. 12 is a sectional view of a manufacturing process illustrating a conventional wiring substrate.
Figure 13:
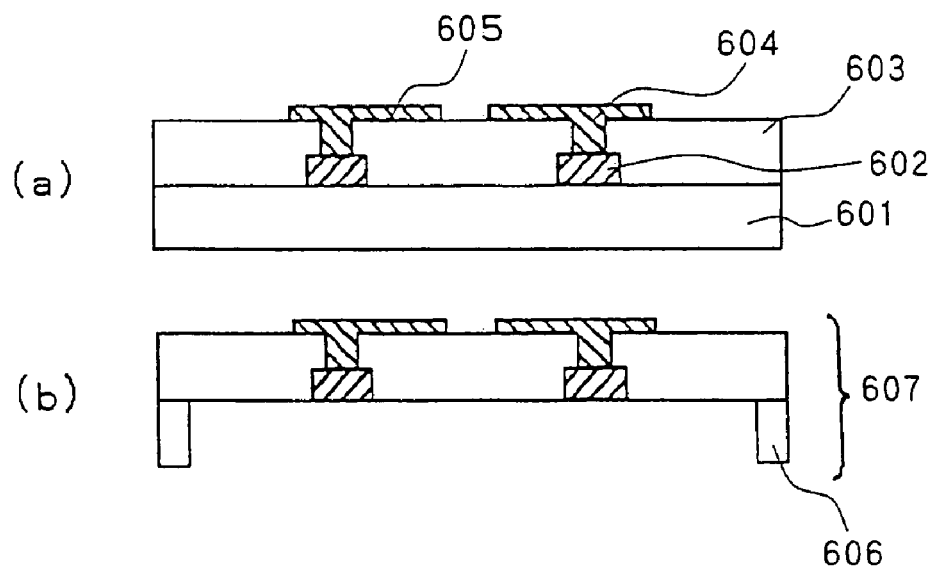
FIG. 13 is a sectional view illustrating a wiring substrate relating to an embodiment of the present invention.

Description will be given of a method of manufacturing a wiring substrate in accordance with an embodiment of the present invention. FIG. 11 is a sectional view of a process of manufacturing the wiring substrate shown in FIG. 1.

First, as shown in FIG. 11(a), a support board 141 made of metal such as stainless steel, Cu, or a Cu alloy is prepared. A resist layer 142 is formed on the support board; the resist layer 142 has an opening pattern corresponding to an upper layer interconnection pattern, a warpage-controlling pattern, and a support pattern. A high etching rate layer 112c, an etching barrier layer 112a, and a pattern main-body layer 112b are formed in the opening pattern in this order by, for example, plating. Examples of the high etching rate layer 112c include a single Cu layer, a single Ni layer, and a two-layer plating layer comprising a Cu layer and an Ni layer. The thickness of the high etching rate layer can be set at, for example, 0.5 to 10 µm. The etching barrier layer 112a may be a plating layer made of, for example, Ni, Au, or Pd. The thickness of the etching barrier layer 112a can be set, for example, between 0.1 and 7 µm. An example of the pattern main-body layer 112b is a plating layer made of Cu, Ni, Au, Al, Pd, or the like. The thickness of the pattern main-body layer 112b can be set at, for example, 2 to 20 µm. Materials for the high etching rate layer and the etching barrier layer can be appropriately selected taking into consideration the etching rate for a material for the support board. With respect to preferred examples of material combinations, an Au plating layer is an example of the etching barrier layer for a support board made of stainless steel. An Ni plating layer is an example of the etching barrier layer for a support board made of copper or a copper alloy. The Ni plating layer has the function of preventing the possible diffusion of solder at high temperatures. Thus, in order to prevent the possible diffusion of solder in the step of mounting a semiconductor chip on the wiring substrate or mounting a semiconductor package having the substrate on a board, the Ni layer can be provided between the pattern main-body layer 112b and the etching barrier layer 112a.

Then, the resist layer 142 is removed as shown in FIG. 11(b). A base insulating film 111 is then formed over the support board 141 in such a manner as to cover the upper layer interconnection 112, a warpage-controlling pattern (not shown), and a support pattern (not shown). The base insulating film 111 can be formed, for example, by sticking and pressing an insulating resin film onto the support board and holding the insulating resin film on the support board, for example, at 100 to 400° C. for 10 minutes to 2 hours for curing. Then, via holes 113 are formed in the base insulating film 111 in a region immediately above the upper layer interconnection 112 by, for example, laser processing as shown in FIG. 11(c).

Then, as shown in FIG. 11(d), a conductive material layer is formed so as to fill the via hole 113, and a lower layer interconnection 114 is formed on the base insulating film 111 by patterning the layer. The conductive material in the via hole 113 and the lower layer interconnection 114 can be formed, for example, by providing a plating layer made of Cu, Ni, Au, Al, Pd, or the like, and patterning the plating layer. The thickness of the conductive material and the lower layer interconnection 114 can be set at, for example, 2 to 20 µm. Then, a solder resist layer 115 having a thickness of about 5 to 40 µm is formed so as to cover a part of the lower layer interconnection 114, while exposing the remaining part thereof. The solder resist layer can be omitted. Instead of forming the solder resist layer, in order to form the above multilayer interconnection structure on the support board, the following steps can be conducted: the steps of forming an interlayer insulating film over the base insulating film so as to cover the entire lower layer interconnection 114; forming via holes in the interlayer insulating film, and forming a conductive material layer so as to fill the via holes; and pattering the layer to form a second lower layer interconnection.

Then, as shown in FIG. 11(e), the whole support board 141 is removed by chemical etching or polishing so as to expose the front surface of the upper layer interconnection 112. The high etching rate layer 112c is then etched away. This results in a wiring substrate in accordance with the example shown in FIG. 1. In this step, when the support board and the high etching rate layer are made of the same material, the board and the layer can be removed by only a single etching treatment.

If an etching barrier layer 112a is formed as the uppermost layer without providing the high etching rate layer 112c, a wiring substrate in accordance with the example shown in FIG. 3 can be obtained by etching away the support board.

The support board 141 is preferably made of a conductive material, particularly a metal material because a conductive layer for interconnection is formed on the support board by electrolytic plating and because the support board 141 made of the above material can be easily removed after the formation of a wiring substrate. The thickness of the support board can be set at about 0.1 to 1 mm to allow the wiring substrate to exhibit a sufficient strength during and after its formation. Too small a thickness of the support board prevents the substrate from exhibiting a sufficient strength. Too large a thickness of the support board increases the weight of the substrate, while degrading its handlability. This also increases the likelihood that the substrate becomes warped or wavy and makes it difficult to form fine interconnections. The material for the support board is not limited to the conductive material or the metal material. The support board may also be made of an insulating material such as silicon wafer, glass, ceramics, or resin. When using a support board made of an insulating material, a conductive layer for interconnection can be formed by electroless plating after the formation of the resist layer 142; alternatively, a conductive layer for interconnection can be formed by electrolytic plating on a conductive underlayer that is formed by means of a film formation method such as electroless plating, sputtering, or vapor deposition after the formation of a resist layer 142.

Method of Manufacturing Semiconductor Device

The wiring substrate formed as described above can be used to form a semiconductor package by means of a well-known method; a semiconductor chip is mounted on the wiring substrate via the bump, as shown in FIG. 10, described above, an underfill is formed as required, and the substrate is then sealed with a mold resin as required. The semiconductor package obtained can be mounted on a board by a well-known method.

In this manufacturing method, the wiring substrate is placed on transfer guide rails with its upper-layer-interconnection-forming side facing upward. If the wiring substrate has the warped shape shown in FIG. 5(a), the transfer direction may correspond to the X-direction. The wiring substrate is transferred to and placed on the stage and then fixed to the stage as described above with reference to FIG. 7. Then, a semiconductor chip is mounted on the fixed wiring substrate. The wiring substrate with the semiconductor chip mounted thereon is subsequently transferred to the subsequent step along two guide rails supporting the respective sides of the substrate extending along the transfer direction. For the conventional wiring substrate, the substrate with the semiconductor chip mounted thereon may be warped with its central part raised along the transfer direction. Thus, the top of the wiring substrate may come into contact with the member located above the transfer route such as the substrate holding guide, which holds both sides of the substrate on the guide rails, or the heating cover. In accordance with an embodiment of the present invention, the warpage can be inhibited so as to prevent the possible contact.

What is claimed is:

1. A wiring substrate comprising:
   a base insulating film;
   a first interconnection formed on a top surface side of the base insulating film;
   a via conductor provided in a via hole formed in the base insulating film; and
   a second interconnection provided on a bottom surface side of the base insulating film, the second interconnection being connected to the first interconnection via the via conductor,
   wherein the wiring substrate comprises a plurality of divided-substrate-unit regions, in each of which the first interconnection, the via conductor, and the second interconnection are formed;
   the wiring substrate further comprises a warpage-controlling pattern on the base insulating film; and
   the wiring substrate has a warped shape such that when the wiring substrate is left at rest on a horizontal plate, at least a central part of a plane surface of the substrate contacts the horizontal plate, with both ends of sides of the plane surface being raised, wherein each of the sides extends along a second direction perpendicular to a first direction in the plane surface of the substrate.

2. The wiring substrate according to claim 1, wherein
   the first interconnection is provided in a sunken section formed on a top surface side of the base insulating film;
   the warpage-controlling pattern is provided in another sunken section formed on the top surface side of the base insulating film and comprises a linear pattern that allows the wiring substrate to be warped so that both ends of each side of a plane surface of the wiring substrate lie above a central part of the side, wherein each of the sides extends along the second direction in the plane surface of the substrate; and
   the wiring substrate has a warped shape such that when the wiring substrate is left at rest on a horizontal plate with the first interconnection forming surface side facing upward, at least a central part of the plane surface of the substrate contacts the horizontal plate, with both ends of the sides of the plane surface being raised, wherein each of sides extends along the second direction.

3. The wiring substrate according to claim 2, wherein the warpage-controlling pattern is provided at least in a peripheral part of a region in which a plurality of the divided-substrate-unit regions are formed.

4. The wiring substrate according to claim 2, wherein for the warpage-controlling pattern and the first interconnection, a component ratio (X/Y) of a total component of X-components extending along the first direction to a total component of Y-components extending along the second direction is greater than 1.

5. The wiring substrate according to claim 3, wherein the warpage-controlling pattern comprises a line and space pattern extending along the first direction.

6. The wiring substrate according to claim 3, wherein the warpage-controlling pattern comprises a plurality of pattern units that are separated from one another.

7. The wiring substrate according to claim 6, wherein the pattern units in the warpage-controlling pattern are arranged in a matrix.

8. The wiring substrate according to claim 2, wherein a ratio (R1/R2) of a planar projected area ratio R1 (A/B) of an in-sunken section pattern area A to an out-sunken section area B in a warpage-controlling-pattern-forming region outside the divided-substrate-unit regions to a planar projected area ratio R2 (P/Q) of an in-sunken section interconnection area P to an out-sunken section area Q inside each of the divided-substrate-unit regions is in a range of 0.8 to 1.2.

9. The wiring substrate according to claim 2, wherein the planar projected area ratio (A/B) of the in-sunken section pattern area A to the out-sunken section area B in the warpage-controlling-pattern-forming region outside the divided-substrate-unit regions is in a range of 0.1 to 0.5.

10. The wiring substrate according to claim 2, wherein the warpage-controlling pattern is formed of the same material as that of the first interconnection and has the same thickness as that of the first interconnection.

11. The wiring substrate according to claim 2, wherein the top surface of the first interconnection is located below the top surface of the base insulating film.

12. The wiring substrate according to claim 2, wherein the top surface of the first interconnection is co-planar with the top surface of the base insulating film.

13. The wiring substrate according to claim 1, further comprising a solder resist layer on the bottom surface side of the substrate.

14. The wiring substrate according to claim 1, wherein the divided-substrate-unit regions are arranged in a matrix.

15. The wiring substrate according to claim 14, wherein the divided-substrate-unit regions are arranged so that the number of divided-substrate-unit regions arranged along the first direction is larger than that of divided-substrate-unit regions arranged along the second direction.

16. The wiring substrate according to claim 1, which is shaped like a rectangle such that each side of the wiring substrate extending along the first direction is longer than each side thereof extending along the second direction.

17. The wiring substrate according to claim 1, which has a warped shape such that each side of the wiring substrate extending in the first direction is entirely raised.

18. The wiring substrate according to claim 1, further comprising one or more interconnection structure layers each including an insulating layer provided on the bottom surface side of the base insulating layer, a via conductor provided in a via hole formed in the insulating layer, and an interconnection provided on a bottom surface of the insulating layer, the interconnection being connected to an upper interconnection via the via conductor.

19. The wiring substrate according to claim 1, wherein the base insulating film is made of a heat-resistant resin or a fiber-reinforced heat-resistant resin composite material.

20. A semiconductor device comprising the wiring substrate according to claim 1, and a semiconductor chip mounted on a top surface side of the wiring substrate, the semiconductor chip being connected to the first interconnection formed on the top surface side of the wiring substrate.

21. A wiring substrate comprising:
    a warpage-controlling pattern on a base insulating film,
    wherein the wiring substrate has a warped shape such that when the wiring substrate is left at rest on a horizontal plate, at least a central part of a plane surface of the substrate contacts the horizontal plate, with both ends of sides of the plane surface being raised, wherein each of the sides extends along a second direction perpendicular to a first direction in the plane surface of the substrate.

22. The wiring substrate according to claim 1, wherein at least a middle part of each of the sides extending along the second direction contacts the horizontal plate, and both the sides extending along the first direction are raised.

23. The wiring substrate according to claim 22, wherein each of the sides extending along the second direction is shorter than every side extending along the first direction.

24. The wiring substrate according to claim 1, wherein each of the sides extending along the second direction is shorter than every side extending along the first direction.

25. The wiring substrate according to claim 24, wherein the contact region of the each side extending along the second direction contains a middle point of the each side, and the length of the contact region is one-third or less of that of the each side.

26. The wiring substrate according to claim 1, wherein the amount by which the both ends of the each side are raised is in a range of 0.2 mm to 5 mm.

* * * * *